United States Patent
Coyne

(10) Patent No.: US 11,024,525 B2
(45) Date of Patent: Jun. 1, 2021

(54) DIFFUSION TEMPERATURE SHOCK MONITOR

(71) Applicant: Analog Devices International Unlimited Company, Limerick (IE)

(72) Inventor: Edward John Coyne, Galway (IE)

(73) Assignee: Analog Devices International Unlimited Company, Limerick (IE)

( * ) Notice: Subject to any disclaimer, the term of this patent is extended or adjusted under 35 U.S.C. 154(b) by 257 days.

(21) Appl. No.: 16/005,499

(22) Filed: Jun. 11, 2018

(65) Prior Publication Data

US 2018/0358248 A1 Dec. 13, 2018

Related U.S. Application Data

(60) Provisional application No. 62/518,542, filed on Jun. 12, 2017.

(51) Int. Cl.
| | |
|---|---|
| *G01K 1/00* | (2006.01) |
| *G01K 13/00* | (2021.01) |
| *G01K 7/00* | (2006.01) |
| *H01L 21/67* | (2006.01) |
| *G01K 7/01* | (2006.01) |

(Continued)

(52) U.S. Cl.
CPC ........ *H01L 21/67248* (2013.01); *G01K 3/005* (2013.01); *G01K 3/04* (2013.01); *G01K 7/01* (2013.01); *G01K 13/00* (2013.01)

(58) Field of Classification Search
USPC ....................................... 374/152, 100, 178
See application file for complete search history.

(56) References Cited

U.S. PATENT DOCUMENTS

| 4,345,477 A | 8/1982 | Johnson |
| 5,007,434 A * | 4/1991 | Doyle ................... A61M 25/09 |
| | | 600/434 |

(Continued)

FOREIGN PATENT DOCUMENTS

| CN | 102576774 A | 7/2012 |
| CN | 103490493 A | 1/2014 |

(Continued)

OTHER PUBLICATIONS

International Search Report and Written Opinion dated Aug. 22, 2018 in connection with International Application No. PCT/EP2018/065444.

(Continued)

*Primary Examiner* — Mirellys Jagan
(74) *Attorney, Agent, or Firm* — Wolf, Greenfield & Sacks, P.C.

(57) ABSTRACT

A temperature shock monitor includes a solvent material and a diffusion material. An energy barrier between the solvent material and the diffusion material is selected to be lower than is would conventionally be used in semiconductor devices such that the diffusion material diffuses into the solvent material when exposed to a temperature above a designated temperature threshold. At a later time, electrical parameters of the temperature shock monitor that change based on the amount of diffusion of the diffusion material into the solvent material allows one to determine whether the temperature shock monitor was exposed to a temperature above the temperature threshold.

20 Claims, 7 Drawing Sheets

(51) Int. Cl.
*G01K 3/04* (2006.01)
*G01K 3/00* (2006.01)

(56) References Cited

U.S. PATENT DOCUMENTS

| | | | |
|---|---|---|---|
| 5,349,336 A | 9/1994 | Nishiura et al. | |
| 5,666,127 A | 9/1997 | Kochiyama et al. | |
| 5,784,242 A | 7/1998 | Watt | |
| 5,946,175 A | 8/1999 | Yu | |
| 5,975,758 A | 11/1999 | Yokota et al. | |
| 6,236,087 B1 | 5/2001 | Daly et al. | |
| 6,249,410 B1 | 6/2001 | Ker et al. | |
| 6,411,544 B1 | 6/2002 | Devin | |
| 6,645,309 B1 | 11/2003 | Myers | |
| 6,741,523 B1* | 5/2004 | Bommarito | G01K 3/04 116/220 |
| 6,819,539 B1 | 11/2004 | Wright et al. | |
| 6,898,061 B1 | 5/2005 | Kimber et al. | |
| 6,920,026 B2 | 7/2005 | Chen et al. | |
| 7,142,400 B1 | 11/2006 | Williams et al. | |
| 7,268,517 B2 | 9/2007 | Rahmel et al. | |
| 7,274,545 B2 | 9/2007 | Marum et al. | |
| 7,411,767 B2 | 8/2008 | Huang et al. | |
| 7,514,804 B2 | 4/2009 | Wang | |
| 7,570,468 B2 | 8/2009 | Bernard et al. | |
| 7,593,202 B2 | 9/2009 | Khazhinsky et al. | |
| 7,630,184 B2 | 12/2009 | Crain et al. | |
| 7,791,481 B2 | 9/2010 | Landt et al. | |
| 7,989,936 B2 | 8/2011 | McCain | |
| 8,000,067 B1 | 8/2011 | Jin et al. | |
| 8,068,319 B1 | 11/2011 | Chan et al. | |
| 8,112,138 B2 | 2/2012 | Reggiardo | |
| 8,164,113 B2 | 4/2012 | Lin et al. | |
| 8,169,760 B2 | 5/2012 | Chang et al. | |
| 8,238,068 B2 | 8/2012 | Shannon et al. | |
| 8,354,300 B2 | 1/2013 | Henderson et al. | |
| 8,373,559 B2 | 2/2013 | McCain | |
| 8,400,743 B2 | 3/2013 | Kosonocky et al. | |
| 8,520,351 B2 | 8/2013 | Hong | |
| 8,582,261 B2 | 11/2013 | Salcedo et al. | |
| 8,630,072 B2 | 1/2014 | Smith | |
| 8,755,195 B2 | 6/2014 | Savory et al. | |
| 8,796,729 B2 | 8/2014 | Clarke et al. | |
| 8,853,799 B2 | 10/2014 | O'Donnell | |
| 8,957,488 B2 | 2/2015 | Keysar et al. | |
| 9,182,436 B1 | 11/2015 | Robinson et al. | |
| 9,311,807 B2 | 4/2016 | Schultz et al. | |
| 9,380,949 B2 | 7/2016 | Schuessler | |
| 9,389,681 B2 | 7/2016 | Sankar et al. | |
| 9,871,373 B2 | 1/2018 | O'Donnell et al. | |
| 2002/0076840 A1 | 6/2002 | Englisch | |
| 2004/0027159 A1 | 2/2004 | Oertle et al. | |
| 2004/0082069 A1 | 4/2004 | Jiang et al. | |
| 2005/0054197 A1 | 3/2005 | Sato et al. | |
| 2005/0127953 A1 | 6/2005 | Oertle et al. | |
| 2005/0133785 A1 | 6/2005 | Eggers et al. | |
| 2006/0256833 A1 | 11/2006 | Jiang et al. | |
| 2006/0274799 A1 | 12/2006 | Collins et al. | |
| 2006/0284302 A1 | 12/2006 | Kim et al. | |
| 2007/0230073 A1 | 10/2007 | Ker et al. | |
| 2007/0297105 A1 | 12/2007 | Brennan et al. | |
| 2008/0074817 A1 | 3/2008 | Crain et al. | |
| 2008/0129523 A1 | 6/2008 | Assimos | |
| 2008/0266730 A1 | 10/2008 | Viborg et al. | |
| 2008/0297939 A1 | 12/2008 | Amemiya | |
| 2009/0287435 A1 | 11/2009 | Ker | |
| 2010/0141094 A1 | 6/2010 | Lee et al. | |
| 2010/0271742 A1 | 10/2010 | Shannon et al. | |
| 2011/0209744 A1 | 9/2011 | Hu | |
| 2011/0261489 A1 | 10/2011 | Zupcau et al. | |
| 2012/0001163 A1 | 1/2012 | Kobayashi et al. | |
| 2012/0006122 A1 | 1/2012 | Aitken | |
| 2012/0017962 A1 | 1/2012 | Skotnicki et al. | |
| 2012/0077291 A1 | 3/2012 | Pasveer et al. | |
| 2012/0153437 A1 | 6/2012 | Chen et al. | |
| 2012/0162849 A1 | 6/2012 | Tang | |
| 2012/0174582 A1 | 7/2012 | Moussavi | |
| 2013/0057111 A1 | 3/2013 | Mukter-Uz-Zaman et al. | |
| 2014/0062381 A1 | 3/2014 | Teggatz et al. | |
| 2014/0246066 A1 | 9/2014 | Chen et al. | |
| 2014/0362481 A1 | 12/2014 | Prabhu et al. | |
| 2015/0108964 A1* | 4/2015 | Kietzmann | G01J 1/02 324/71.1 |
| 2015/0270178 A1 | 9/2015 | Alptekin et al. | |
| 2015/0308901 A1* | 10/2015 | Salman | G01K 3/04 374/102 |
| 2016/0009547 A1 | 1/2016 | Mason et al. | |
| 2016/0285255 A1 | 9/2016 | O'Donnell et al. | |
| 2016/0372391 A1 | 12/2016 | Davis et al. | |
| 2017/0299649 A1 | 10/2017 | Coyne et al. | |
| 2017/0299650 A1 | 10/2017 | Coyne et al. | |
| 2018/0115155 A1 | 4/2018 | Kuo | |

FOREIGN PATENT DOCUMENTS

| | | |
|---|---|---|
| DE | 41 26 376 A1 | 2/1993 |
| EP | 2 280 458 A1 | 2/2011 |
| EP | 2 333 925 A1 | 6/2011 |
| JP | H04-152664 A | 5/1992 |
| JP | 2000-223685 A | 8/2000 |
| JP | 2002-111041 A | 4/2002 |
| JP | 2002-246514 A | 8/2002 |
| JP | 2005-283389 A | 10/2005 |
| JP | 2006-352136 A | 12/2006 |
| JP | 2008-173462 A | 7/2008 |
| JP | 2009-081160 A | 4/2009 |
| JP | 2009-200189 A | 9/2009 |
| TW | 200912555 A | 3/2009 |
| TW | 201222830 A | 6/2012 |
| TW | 201234138 A1 | 8/2012 |
| TW | 201317559 A1 | 5/2013 |
| TW | 201347002 A | 11/2013 |
| TW | 201517213 A | 5/2015 |
| WO | WO 2010/053997 A1 | 5/2010 |
| WO | WO 2010/100929 A1 | 9/2010 |
| WO | WO 2010/136919 A1 | 12/2010 |
| WO | WO 2013/092823 A1 | 6/2013 |

OTHER PUBLICATIONS

International Search Report and Written Opinion dated Aug. 8, 2017 in connection with International Application No. PCT/US2017/027988.

Extended European Search Report dated Aug. 5, 2016 in connection with European Patent Application No. 16160442.6.

Taiwanese Search Report dated Oct. 19, 2017 in connection with Taiwanese Application No. 106113115.

ESD Patent Report—Additional Search for Concepts in 3 US Patents and Ideas in Alan's May 5, 2014 email Innography. 2013; 9 pages.

Haus et al., Electromagnetic Fields and Energy, Chapter 6 (Massachusetts Institute of Technology: MIT OpenCourseWare). Available at http://ocw.mit.edu.resources/res-6-001-electromagnetic-fields-and-energy-spring-2008/chapter-6/06.pdf (accessed Jul. 27, 2015). License: Creative Commons Attribution-Noncommercial-Share Alike. Also available from Prentice-Hall: Englewood Cliffs, NJ, 1989. ISBN: 9780132490207.

Huang et al., Electroactive Polymers. MIT Technology Review, Dec. 1, 2002. Available at: http://www.technologyreview.com/article/401750/electroactive-polymers/ (accessed Jul. 27, 2015).

Improvements to ESD Structures-Alternate Uses of ESD-Patent Report. Innography. 2013; 16 pgs.

Jones, Diffusion in Silicon. IC Knowledge LLC, 2000, 71 pgs.

Lee et al., Triboelectric Energy Harvester Based on Wearable Textile Platforms Employing Various Surface Morphologies. Nano Energy, Mar. 2015, vol. 12, pp. 410-418.

Mhira et al., Mission Profile Recorder: An Aging Monitor for Hard Events. Reliability Physics Symposium (RPS). 2016 IEEE International, IEEE, 2016, pp. 4C-3-1-4C-3-5.

(56) References Cited

OTHER PUBLICATIONS

Premchand et al., Bulk silicon based temperature sensor. University of South Florida Scholar Commons. 2005; 74 pages.
Suzuki, Development of a Mems Energy Harvester With High-Performance Polymer Electrets. Department of Mechanical Engineering, The University of Tokyo, Bunkyo-ku, Japan. Jan. 2010, 6 pages. Available at http://blog.nus.edu.sg/a0066807/files/2011/03/047_Suzuki_9922.pdf (accessed Jul. 27, 2015).
Tasca, Pulse Power Failure Modes in Semiconductors. IEEE Transactions on Nuclear Science. Dec. 1970; 17(6):364-72.
U.S. Department of Transportation, Federal Highway Administration Research and Technology, Chapter 2, Traffic Detector Handbook: Third Edition—vol. 1. May 2006. Available at http:www.fhwa.dot.gov/publications/research/operations/its/06108/02a.cfm (accessed Jul. 27, 2015).
Wang et al., Silicon Odometers: Compact In Situ Aging Sensors for Robust System Design. IEE Micro. Nov.-Dec. 2014; 34(6):74-86.
Wunsch et al., Determination of Threshold Failure Levels of Semiconductor Diodes and Transistors Due to Pulse Voltages. IEEE Transactions on Nuclear Science. Dec. 1968; 15(6):244-59.
EP 18731405.9, Dec. 8, 2020, European Examination Report.
European Examination Report dated Dec. 8, 2020 in connection with European Application No. 18731405.9.

\* cited by examiner

DIFFUSION TEMPERATURE SHOCK MONITOR

CROSS-REFERENCE TO RELATED APPLICATION

This application claims the benefit under 35 U.S.C. § 119(e) of U.S. Provisional Patent Application Ser. No. 62/518,542, entitled "DIFFUSION TEMPERATURE SHOCK MONITOR," filed on Jun. 12, 2017, which is hereby incorporated herein by reference in its entirety.

FIELD OF THE DISCLOSURE

The present application relates to temperature shock monitors that use atomic diffusion.

BACKGROUND

There are a number of products that, when exposed to high temperatures, even for a short period of time, either become unusable or underperform compared to products that have not been exposed to high temperatures. For example, the working lifetime of some electronic circuits may decrease as a result of exposure to high temperatures as a result of, by way of example and not limitation, unexpected carrier injection and trapping of charges in gate oxides of transistors in the circuits. At extreme temperatures, some electronic circuits may fail completely. As another example, perishable goods, such as fruit and vegetables, maintain freshness and have a longer shelf life when kept at cool temperatures. Exposure to high temperatures can increase the rate of decay and affect the quality of the perishable goods.

Temperature monitors can be used to monitor conditions for electronics and perishable goods. The conditions being monitored may be operational conditions, such as the temperature of electronic circuits during operation, or shipping and storing conditions, such as the temperature of a vehicle transporting electronics and/or perishable goods from one location to another.

SUMMARY OF THE DISCLOSURE

Some aspects of the present disclosure are directed to a temperature shock monitor includes a solvent material and a diffusion material. An energy barrier between the solvent material and the diffusion material is selected to be lower than is would conventionally be used in semiconductor devices such that the diffusion material diffuses into the solvent material when exposed to a temperature above a designated temperature threshold. At a later time, electrical parameters of the temperature shock monitor that change based on the amount of diffusion of the diffusion material into the solvent material allows one to determine whether the temperature shock monitor was exposed to a temperature above the temperature threshold.

Some embodiments are directed to a temperature shock monitor for determining whether a temperature threshold is exceeded, the temperature shock monitor including a solvent material and a first diffusion material. An energy barrier between the solvent material and the first diffusion material is less than 2.0 eV.

Some embodiments are directed to a method of determining whether a temperature threshold is exceeded using a solvent material, a first diffusion material, and an energy barrier between the solvent material and the first diffusion material. The method includes diffusing the first diffusion material into the first solvent material by exposing the solvent material and the first diffusion material to a temperature sufficient to exceed the energy barrier, and detecting an electrical property of the solvent material that is indicative of a concentration of the first diffusion material in the first solvent material.

Some embodiments are directed to a semiconductor device that includes a core circuit and a temperature shock monitor for determining whether a temperature threshold is exceeded. The temperature shock monitor includes a solvent material and a first diffusion material. An energy barrier between the solvent material and the first diffusion material is less than 2.0 eV.

BRIEF DESCRIPTION OF THE DRAWINGS

Various aspects and embodiments of the present disclosure will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
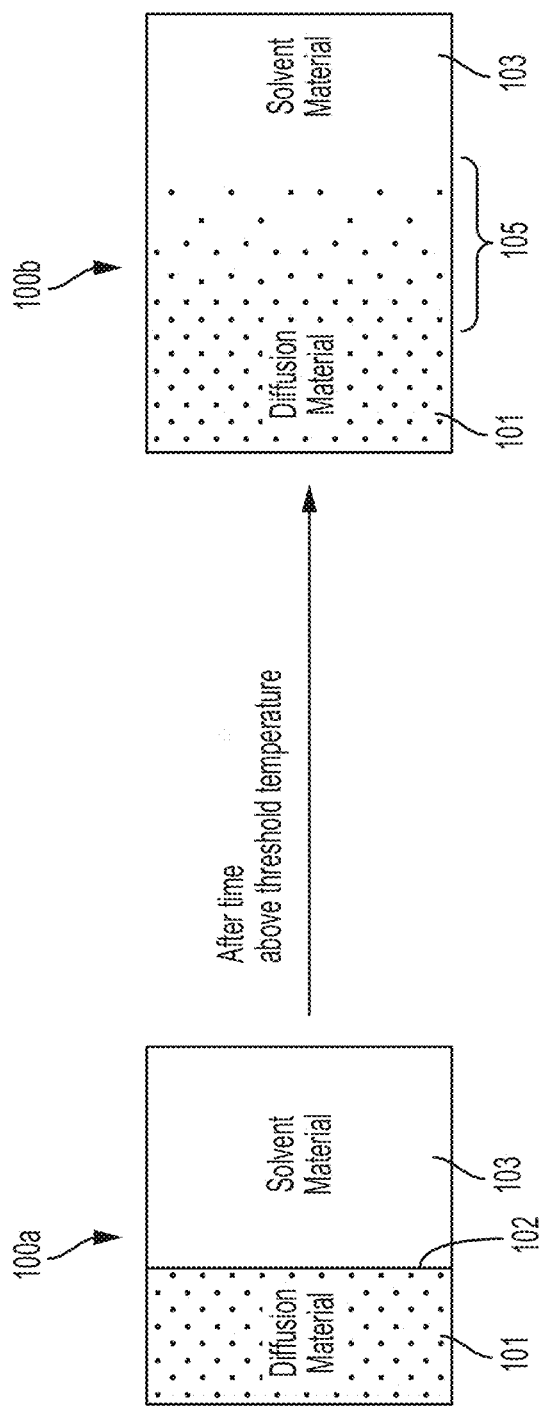
FIG. 1 is a schematic diagram of a temperature shock sensor, according to some embodiments.

The inventor has recognized and appreciated that can be burdensome and costly to monitor the temperature of products, such as electronics and/or perishable items. Conventional techniques require electronic temperature monitors that require electrical power and/or memory to measure, record and save temperature data. Such conventional temperature monitors can be expensive to manufacture and unreliable over long periods due to the finite lifetime of a battery that supplies the requisite electrical power to the temperature monitor.

The inventor has recognized and appreciated that to determine whether a temperature threshold is exceeded, a conventional temperature monitor that keeps a complete temperature record, e.g., a record of the temperature of a device and/or the device environment as a function of time, is not necessary. Instead, a temperature shock monitor, which determines whether a temperature threshold is exceeded but does not necessarily keep a complete temperature record, may be used. The inventor has further recognized and appreciated that temperature shock monitors may be manufactured simply and cheaply by utilizing the exponential dependency of atomic diffusion on temperature to permanently record a transient temperature shock. Moreover, such temperature shock monitors may not require a power source, such as a battery, and therefore can operate over long periods of time.

Aspects of the present application provide a temperature shock monitor that can detect temperature spikes in an unpowered state. The monitor includes a solvent material, which may comprise a semiconductor, and a first diffusion material, which may comprise a dopant. The sensor utilizes the fact that diffusion has an exponential dependence on temperature and a square root dependence on time. As a result, measuring an electrical property that relates to the concentration of the first diffusion material in the solvent material and one of the temperature or time may provide information about the other of the temperature or time. Additionally, a short and sharp temperature spike may cause a detectable change in diffusion, while exposure to a lower temperature over a longer period of time may not. After diffusion, the concentration of the first diffusion material into the solvent material may be measured repeatedly, providing memory of the temperature spike.

In some embodiments, a temperature shock monitor may include more than one diffusion material. For example, a second diffusion material may be included in addition to the first diffusion material. The two diffusion materials may be selected such that first diffusion material diffuses at a different rate than the second diffusion material. In some embodiments, the two diffusion materials are arranged such that the diffusion of each individual material may be measured. By including multiple diffusion materials, each with different rates of diffusion within the solvent material allows not only the determination of whether a temperature threshold was exceeded, but also a determination of how much time the temperature shock monitor spent at a high temperature exceeding the threshold.

In some embodiments, an energy barrier, or required activation energy, between the diffusion material and the solvent material may prevent diffusion of the diffusion material. In one embodiment, the energy barrier is approximately 2.0 eV. The energy barrier may be overcome by applying a temperature spike for a time interval. The energy barrier may be controlled by the type of diffusion material chosen, or by incorporating a structure that increases the energy barrier. An electrical signal may be used to overcome the energy barrier of the structure. In this way, diffusion of the first diffusion material into the solvent material may be prevented prior to activation by a user.

By way of example and not limitation, a temperature shock monitor may include an oxide barrier between the second diffusion material and the solvent material, and an electrical signal supplying 700° C. in one microsecond may overcome the oxide barrier energy and activate the temperature monitor. In one embodiment, the solvent material comprises silicon and the first diffusion material comprises an element with a suitable activation energy. In some embodiments, the activation energy requires a 200° C. temperature spike over a microsecond, and a suitable element may be silver, gold, copper, or another suitable dopant. In other embodiments, the temperature threshold is adjustable depending on the target application. Some embodiments of a temperature shock monitor may include a silicon p-n junction, wherein the diffusion of the second diffusion material may be controlled by an electric field within the p-n junction and a temperature spike. In such embodiments, information beyond the presence of a temperature spike may be extracted.

In some embodiments, the diffusion of one or more diffusion materials into the solvent material may permanently record temperature spikes. Changes in diffusion may be detected by measuring electrical characteristics related to the amount of diffusion material within the solvent material, such as diode leakage, junction voltage, gain, transient response, and threshold voltage, among others. Such quantities may indicate the concentration of the diffusion material within the solvent material, and the concentration may indicate the temperature spike and time interval. In some embodiments, a metal contact in contact with a silicon p-n junction measures changes in such quantities following diffusion of the second diffused material across a barrier and into the junction.

The diffusion material may be selected based on its activation energy, where the activation energy is the depth of an energy well an atom of the diffusion material sits at the bottom of. For example, depending on the application (the type of temperature event to be monitored), a lower or higher activation energy may be desirable. Thus, a diffusion material (e.g., a dopant) may be selected based on having a desired activation energy sufficient to react to the type of temperature event to be detected. Diffusion material with too low an activation energy may diffuse too quickly, while diffusion material with too high an activation energy may diffuse too slowly. As a non-limiting example, gold may be suitable for detecting a desired temperature event, while boron, phosphorous, antimony may diffuse too slowly to detect the same type of temperature event. Sodium and H2 may diffuse too quickly to detect the desired temperature event. Again though, as noted the suitability of the diffusion material may depend on the temperature event to be detected. Thus, boron, phosphorous, and antimony may be preferable to gold for detecting certain temperature events.

The inventor has further recognized and appreciated that atomic diffusion is undesirable in conventional electrical components. Thus, a diffusion material may be selected that would not be selected for conventional electrical circuit components, such as transistors. For example, an energy barrier between gold and silicon is approximately 1.12 eV, which is too low to be used to form reliable traditional electrical components, but may be useful as a temperature shock monitor, according to some embodiments. Similarly, silver, with an energy barrier of approximately 1.6 eV, and copper, with an energy barrier of approximately 1.0 eV, may be suitable as a diffusion material according to some embodiments.

FIG. 1 is a schematic diagram of a temperature shock sensor 100a before diffusion of a diffusion material and the same temperature shock sensor 100b after diffusion of the diffusion material, according to some embodiments. The temperature shock sensor 100a includes a diffusion material 101 and a solvent material 103. A solvent-diffusion interface 102 may be located between the solvent material 103 and the diffusion material 101. The diffusion of the diffusion material 101 into the solvent material 103 is caused by the temperature shock sensor being exposed to a temperature above a threshold temperature. The exposure to such a high temperature creates a diffusion region 105 in the temperature shock sensor 100b, where a portion of the diffusion material 101 is intermixed with the solvent material 103.

The solvent material 103 may be any suitable solid state material for atomic diffusion. In some embodiments, the solvent material 103 forms a solvent lattice. For example, the solvent material 103 may be silicon. In some embodiments, a silicon substrate may be used as the solvent material 103.

The diffusion material 101 may be any suitable material that diffuses into the solvent material 103. In some embodiments, the diffusion material is a material that is mobile within a lattice of the solvent material and does not become part of the solvent lattice. In some embodiments, the diffusion material 101 is selected such that an energy barrier between the solvent material 103 and the diffusion material 101 has a particular value based on an activation energy. In some embodiments, the energy barrier may be greater than or equal to 0.7 eV. For example, the energy barrier may be between 1.0 eV and 3.0 eV, between 1.0 eV and 2.0 eV, or between 1.1 eV and 1.7 eV. By way of example and not limitation, some embodiments may include the following energy barriers using the associated materials: the energy barrier between copper and silicon is 1.0 eV; the energy barrier between gold and silicon is 1.12 eV; the energy barrier between silver and silicon is 1.6 eV; the energy barrier between platinum and silicon is 2.22 eV; and the energy barrier between aluminum and silicon is 3.0 eV. By way of comparison, the energy barrier for phosphorous (a common dopant used in semiconductor devices where diffusion is preferably avoided) in silicon is 3.36 eV.

In some embodiments, the energy barrier is selected to be suitable for a particular application. For example, a lower the energy barrier results in a lower temperature threshold resulting in faster diffusion. Thus, for monitoring temperature shock at lower threshold temperatures, such as the case when used in an application involving the shipping of perishable goods, the temperature shock monitor may use copper and/or gold as the diffusion material 101. For monitoring temperature shock at higher threshold temperatures, such as the case when used in an application shipping or operating electronic circuits, the temperature shock monitor may use silver, platinum, and/or aluminum as the diffusion material 101.

Figure 2:
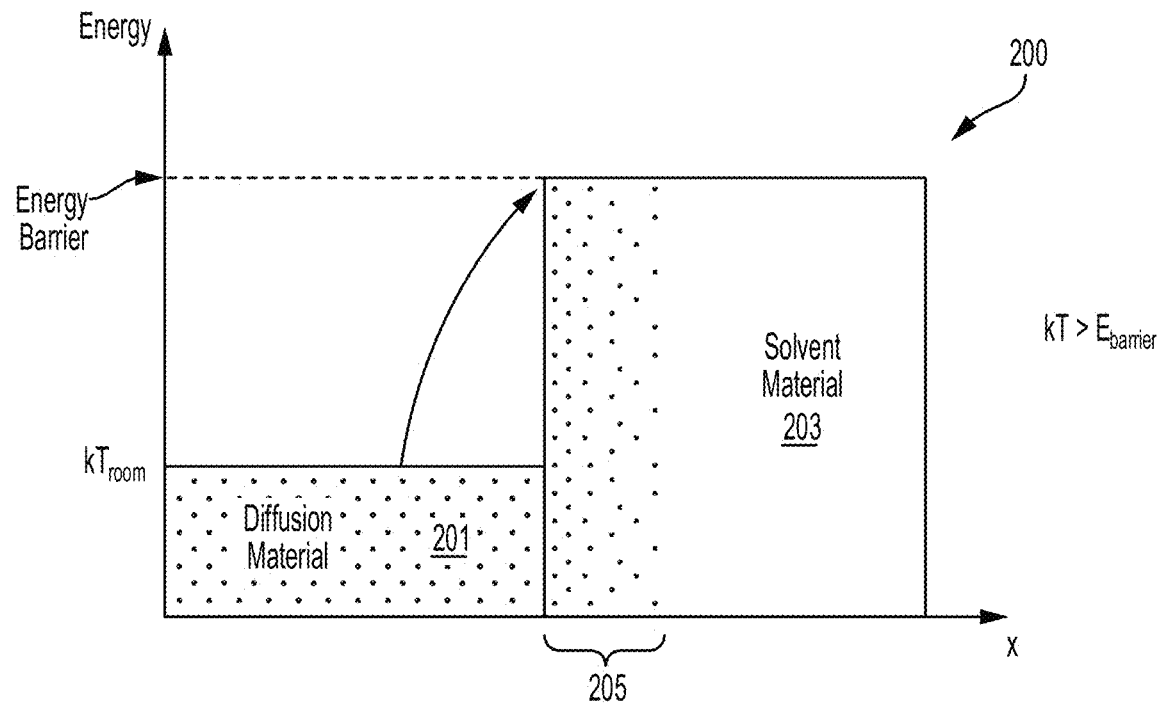
FIG. 2 is an illustration of an energy barrier between a diffusion material and a solvent material based on an activation energy, according to some embodiments.

FIG. 2 illustrates the energy barrier in a temperature shock monitor 200, according to some embodiments. As shown in FIG. 2, in some embodiments, the energy barrier between a diffusion material 201 and a solvent material 203 is based on an activation energy. The diffusion material 201 is in physical contact with the solvent material 203. After the thermal energy, kT, where k is Boltzmann's constant and T is the temperature of the temperature shock monitor 200, exceeds the energy barrier, $E_{barrier}$, the diffusion material atoms overcome the energy barrier and begin diffusing across the interface between the diffusion material 201 and the solvent material 203, forming a diffusion region 205. The concentration of the diffusing material in the diffusion region 205 is a function of the thermal energy (and therefore the temperature) and the time the temperature shock monitor 200 is maintained at a temperature above the energy barrier.

In some embodiments, the activation energy of the diffusion material is below 700° C. applied for a microsecond or less. In other embodiments, the activation energy of the first diffusion material is below 200° C. applied in a steady state condition.

Figure 3:
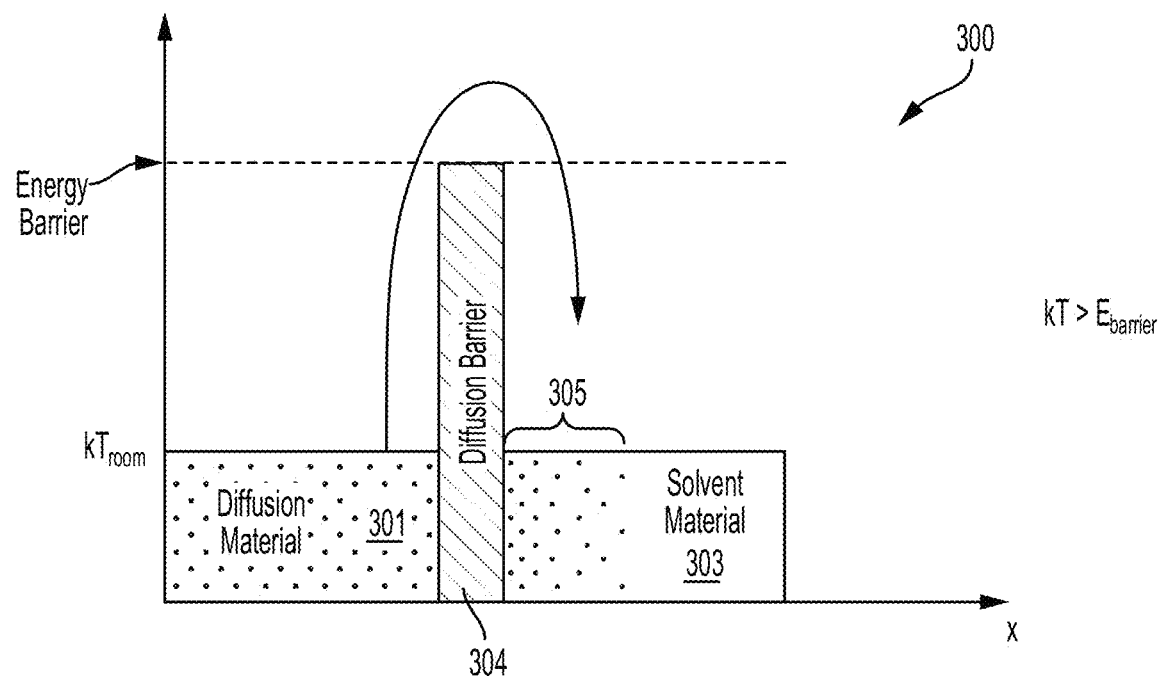
FIG. 3 is an illustration of an energy barrier between a diffusion material and a solvent material based on the use of a barrier material, according to some embodiments.

FIG. 3 illustrates the energy barrier in a temperature shock monitor 300, according to some embodiments. As shown in FIG. 3, in some embodiments, the energy barrier is a result of a diffusion barrier material 304 positioned between the diffusion material 301 and the solvent material 303. The diffusion material 301 is not in physical contact with the solvent material 303. The diffusion barrier material 304 imposes a higher energy barrier than the activation energy of the diffusion material in the solvent material 303. In some embodiments, as shown in FIG. 3, the activation energy of the diffusion material 301 in the solvent material 303 can be near zero as the energy barrier can be provided mostly by the diffusion barrier material 304. In other embodiments, the activation energy of the diffusion material 301 in the solvent material 303 may be between 1.0 eV and 3.0 eV, between 1.0 eV and 2.0 eV, or between 1.1 eV and 1.7 eV. In some embodiments, the diffusion barrier material 304 may be an insulator and/or a dielectric. For example, the diffusion barrier material 304 may include a silicon oxide.

After the thermal energy, kT, where k is Boltzmann's constant and T is the temperature of the temperature shock monitor 300, exceeds the energy barrier, $E_{barrier}$, the diffusion material atoms overcome the energy barrier and begin diffusing into the solvent material 303, forming a diffusion region 305. The concentration of the diffusing material in the diffusion region 305 is a function of the thermal energy (and therefore the temperature) and the time the temperature shock monitor 200 is maintained at a temperature above the energy barrier.

In some embodiments, the temperature shock sensor 300 may be activated by a user at a desired time. This activation may be done using an electrical shock or a thermal shock. The energy barrier may be set high such that little to no diffusion material 301 diffuses into the solvent material 303 prior to activation by the user. In some embodiments, if the activation energy of the diffusion material 301 in the solvent material is greater than the thermal energy based on the temperature of the temperature shock sensor 300, the atoms of diffusion material 301 will stay localized near the interface of the diffusion barrier material 304 and the solvent material 303 and will not diffuse a significant distance into the solvent material 303. In this way, the temperature shock sensor 300 may be activated and still be able to determine whether the temperature shock sensor 300 is exposed to temperatures above a threshold temperature set by the activation energy of the diffusion material 301 in the solvent material.

Figure 4:
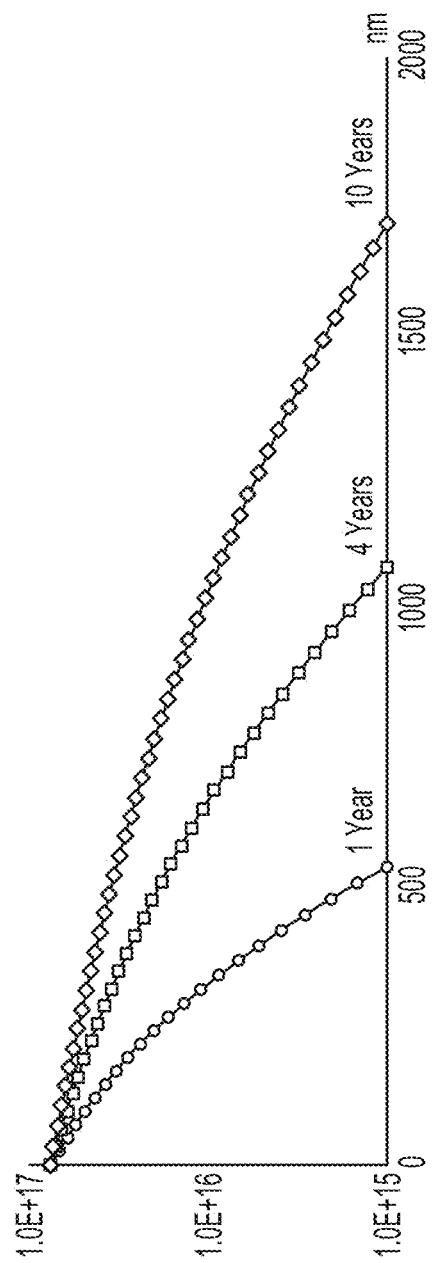
FIG. 4 is a graph of diffusion material concentrations as a function of depth into the solvent material for three different time periods, according to some embodiments.

FIG. 4 is a graph of diffusion material concentrations as a function of depth within the solvent material, according to some embodiments. The three lines represent one year, four years and 10 years at a temperature above the threshold temperature. The depth of diffusion into the solvent material depends on the amount of time a temperature shock sensor is in an environment above the threshold temperature. As illustrated in FIG. 4, the concentration of the diffusion material near the interface of the diffusion material with the solvent material (x=0 nm) is higher than at depths of x=500 nm to x=2000 nm. But there may be significant concentrations of diffusion material at depths up to 2000 nm in the solvent material. The presence of diffusion material in the solvent material is permanent and the cause of the diffusion is based on the thermal energy, requiring no electrical power, in some embodiments.

The presence of diffusion material within the solvent material may affect one or more electrical properties of a thermal shock sensor. In some embodiments, an electrical property such as diode leakage, junction voltage, gain, transient response, and threshold voltage, among others, may be measured at a point in time after the diffusion occurs to determine whether the temperature threshold was exceeded at any past time.

Figure 5:
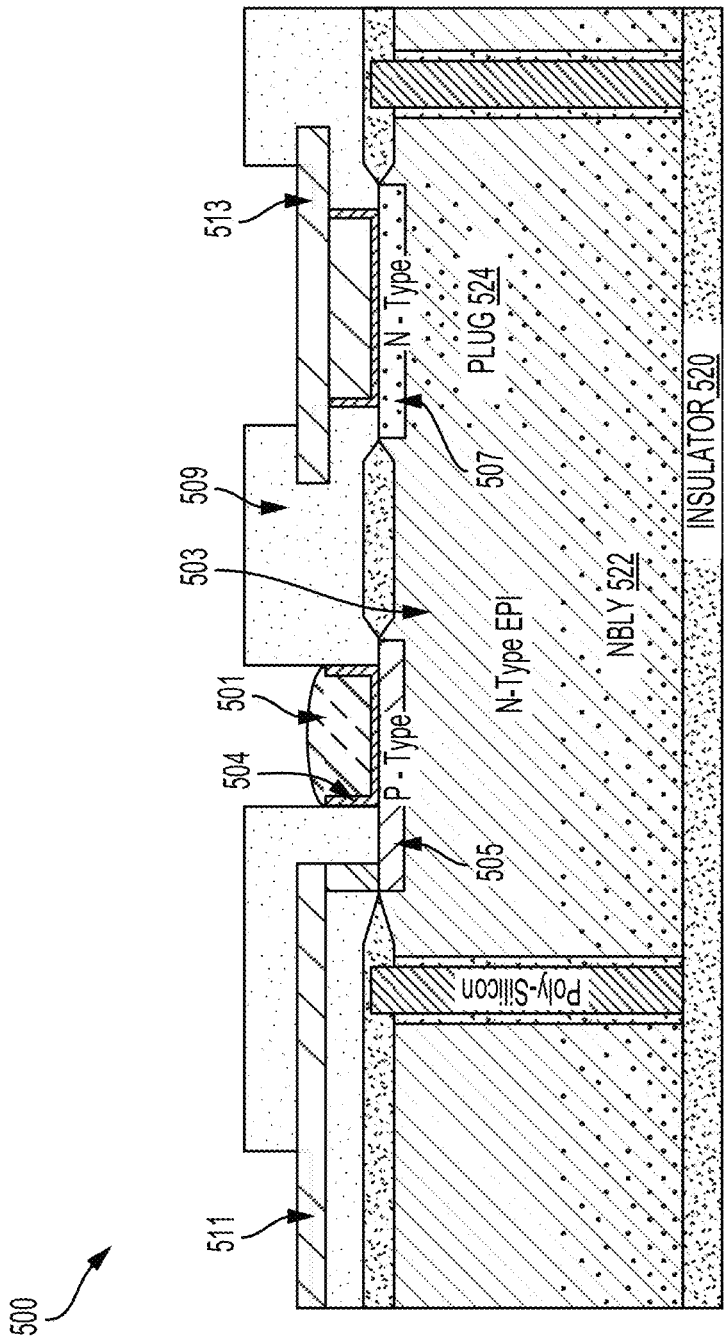
FIG. 5 is a schematic diagram of a temperature shock sensor including a p-n junction, according to some embodiments.

FIG. 5 is a schematic diagram of a temperature shock sensor 500 that includes a p-n junction, according to some embodiments. The temperature shock sensor 500 includes a diffusion material 501, a solvent material 503, and an optional diffusion barrier material 504. As discussed above, the diffusion material 501 is configured to diffuse into the solvent material 503 when the temperature exceeds a threshold temperature. The presence of diffusion material 501 in the solvent material 503 will affect the electrical properties of the p-n junction. These changes in electrical properties may include the leakage current of the diode formed by the p-n junction.

In some embodiments, the temperature shock sensor 500 further includes a p-type semiconductor 505, an electrical contact 511, an n-type semiconductor 507, an electrical contact 513, an insulating material 509, an insulator 520, n-type buried diffusion 522, and an n-type plug doped region 524. The diffusion material 501 is positioned in contact with the p-type semiconductor 507 or, if it is present, in contact with the optional diffusion barrier material 504, which is in contact with the p-type semiconductor 507. The p-type semiconductor 505 is on top of the solvent material 503, which may be an n-doped semiconductor, such as epitaxial silicon. The n-type semiconductor 507 is also on top of the solvent material 503. Electrical contact 511 is electrically connected to the p-type semiconductor 505 and electrical contact 513 is electrically connected to the n-type semiconductor. The solvent material 503 may include the n-type buried diffusion 522, which is a highly doped region of the semiconductor solvent material 503 that serves as a low resistance path for the diode current, enabling the full area of the diode to be efficiently used rather than just the edges. The solvent material 503 is in physical contact with the insulator 520 electrically and physically isolates the temperature shock sensor 500 from surrounding circuitry that may be present in some embodiments. The n-type plug doped region 524 makes a vertical electrical connection to the n-type buried diffusion 522 in order to complete the electrical path for diode current to the surface of the temperature shock sensor 500. Electrical properties of the diode of the temperature shock sensor 500 may be measured by supplying a current and/or voltage to one or more of the electrical contacts 511 and 513. The insulating material 509 prevents electrical coupling of portions of the temperature shock sensor 500 should not be in physical contact with one another.

In some embodiments, as illustrated in FIG. 5, the diffusion material 501 is positioned neared to the p-type material than the n-type material. In other embodiments, the solvent material is positioned neared to the n-type material than the p-type material. Having the diffusion material 501 nearer to one of the electrodes of the temperature shock sensor 500 may increase the sensitivity of a measurement of an electrical property of the temperature shock sensor 500.

In some embodiment, the amount of diffusion material 501 that has diffused into the solvent material 503 may be determined by measuring the reverse leakage current of the diode. Additionally or alternatively, the p-n junction potential may be measured to determine the concentration of the diffusion material 501 within the solvent material 503.

Figure 6:
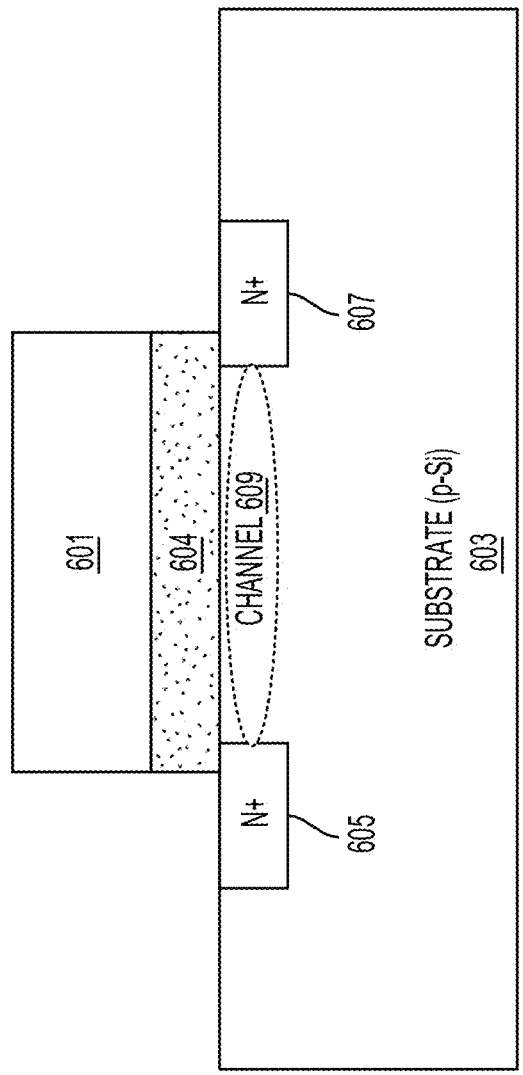
FIG. 6 is a schematic diagram of a temperature shock sensor including a metal-oxide-semiconductor field-effect transistor-like (MOSFET-like) design, according to some embodiments.

FIG. 6 is a schematic diagram of a temperature shock sensor 600 including a metal-oxide-semiconductor field-effect transistor-like (MOSFET-like) design, according to some embodiments. The temperature shock sensor 600 includes a diffusion material 601, a solvent material 603, a diffusion barrier material 604, an n-type semiconductor source 605, an n-type semiconductor drain 607 and a channel 609. The diffusion material is separated from the channel 609, the n-type semiconductor source 605, and the n-type semiconductor drain 607 by a diffusion barrier material 604. In the temperature shock sensor 600, the diffusion barrier material 604 replaces what would traditionally be the gate in this MOSFET-like design. The solvent material 603 may be, for example, a p-type semiconductor substrate (e.g., p-Si).

When a temperature shock occurs that exceeds the temperature threshold, atoms of the diffusion barrier material 604 diffuse into the channel 609 of the solvent material 603. The channel 609 is the portion of the solvent material 603 between the n-type semiconductor source 605 and the n-type semiconductor drain 607 and in physical contact with the diffusion barrier material 604. The presence of the diffusion material 601 in the channel 609 affects electrical properties of the transistor of the temperature shock monitor 600, such as the leakage current.

In some embodiments, a measurement of the leakage current determines whether the temperature shock monitor 600 experienced a temperature shock event (e.g., the temperature exceeded the temperature threshold). By way of example and not limitation, the leakage current may be measured by applying a current to the n-type semiconductor source 605 and measuring the current leaking from the n-type semiconductor drain 607.

Figure 7:
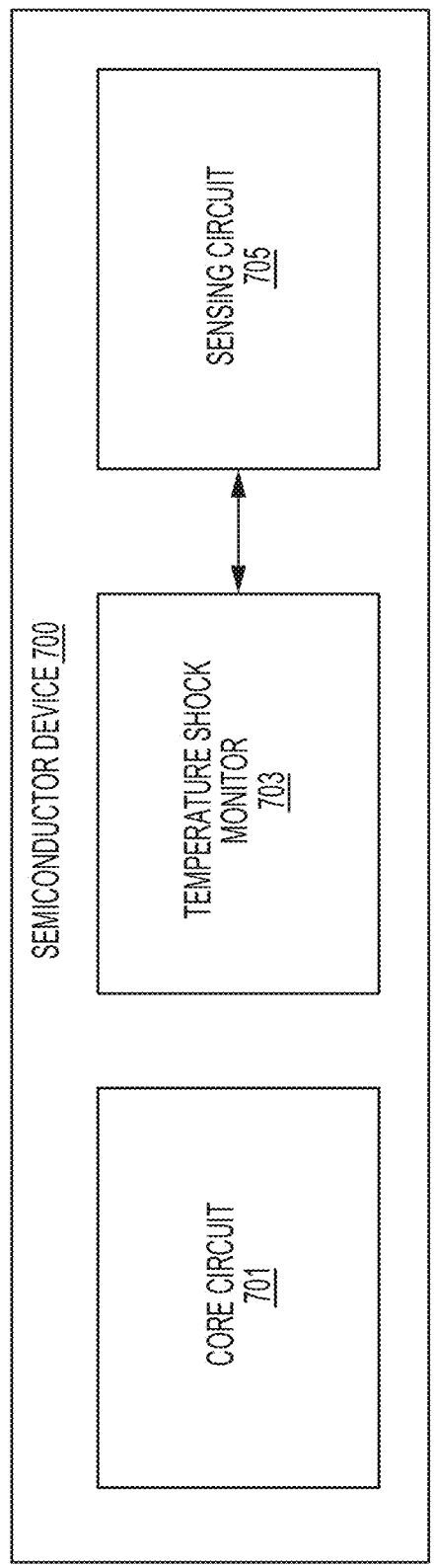
FIG. 7 is a semiconductor device that includes a temperature shock sensor, according to some embodiments.

FIG. 7 is a schematic diagram of a semiconductor device 700 that includes a temperature shock sensor, according to some embodiments. The semiconductor device 700 includes a core circuit 701, a temperature shock monitor 703, and a sensing circuit 705. The temperature shock monitor 703 is in thermal contact with the core circuit 701. In this way, the temperature shock monitor 703 may determine whether the core circuit 701 experiences a thermal shock event during operation. The sensing circuit 705 is used to perform one or more of the above-mentioned measurements of an electrical property of the temperature shock monitor 703 that is affected by the diffusion material diffusing into the solvent material of the temperature shock monitor 703.

The core circuit 701 may be any electrical circuit a user desires to monitor for temperature shock events. In some embodiments, the core circuit 701 and the temperature shock monitor 703 are formed within a common semiconductor substrate. By sharing the same semiconductor substrate, the thermal coupling between the core circuit 701 and the temperature shock monitor 703 may be increased relative a device that formed the core circuit 701 and the temperature shock monitor 703 on different substrates.

The sensing circuit 705 may be formed in or on the common semiconductor substrate, in some embodiments. The sensing circuit 705 is electrically connected to the temperature shock monitor 703 such that at least one electrical property of the temperature shock monitor 703 may be measured. For example, the sensing circuit may include a voltage source and/or a current source and a voltmeter and/or an ammeter. One or more conductive traces may electrically connect the sources and meters of the sensing circuit 705 to one or more electrical contacts of the temperature shock monitor 703, such as electrical contact 511 and electrical contact 513 of FIG. 5 or electrical contacts (not shown) that connect to the n-type semiconductor source 605 and the n-type semiconductor drain 607 of FIG. 6. The sensing circuit 705 is configured to apply a voltage and/or current to the temperature shock monitor 703 and measure a resulting voltage and/or current of the temperature shock monitor 703 to determine whether a shock event occurred at any time in the past.

Figure 8:
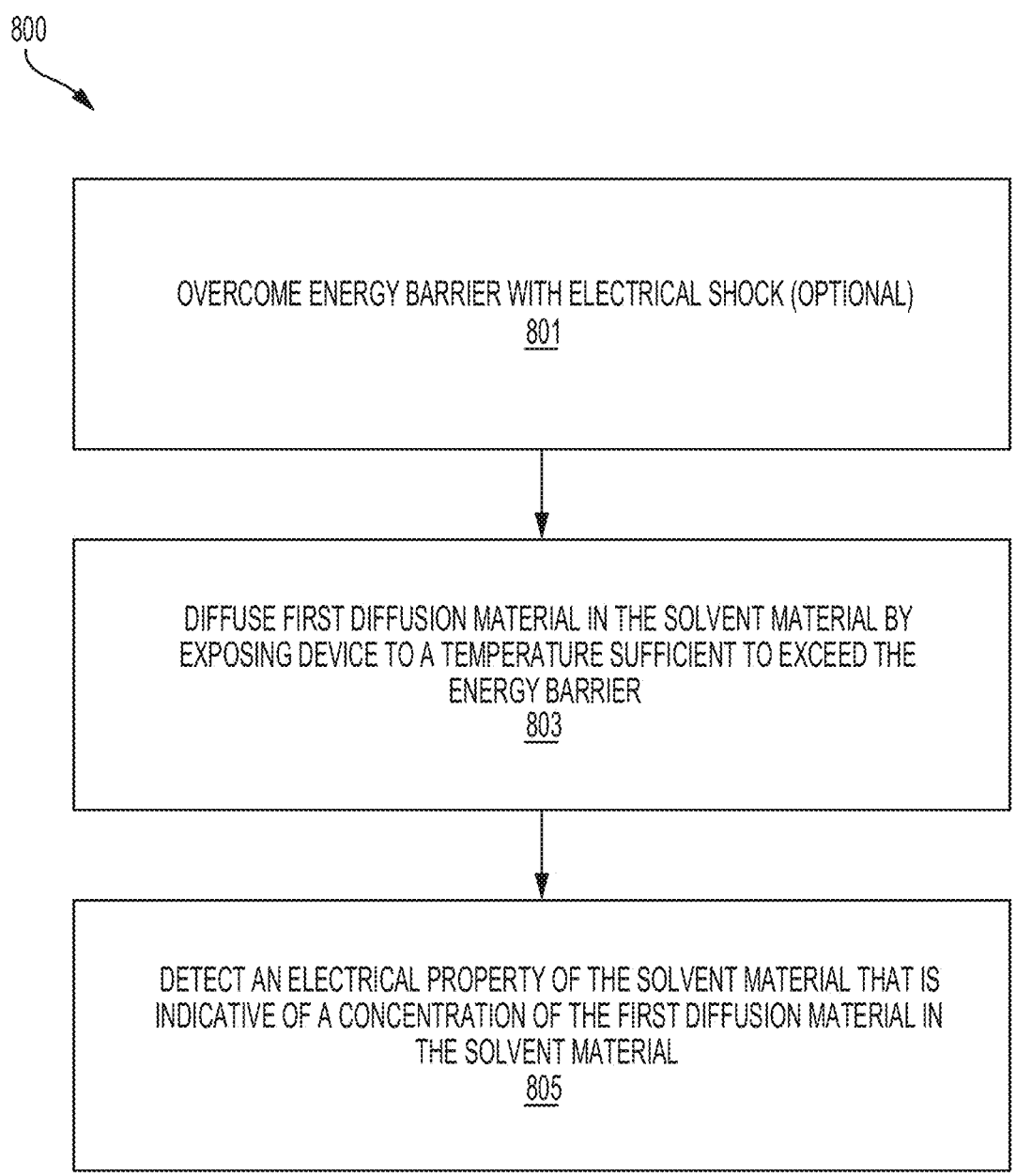
FIG. 8 is a flow chart of a method of determining whether a temperature threshold is exceeded, according to some embodiments.

FIG. 8 is a flow chart of a method 800 of determining whether a temperature threshold is exceeded, according to some embodiments.

At block 801, which is optional, a temperature shock monitor overcomes an energy barrier with an electrical shock. This may be done by applying a current to the diffusion material of the temperature shock monitor to cause a portion of the diffusion material to diffuse into the solvent material of the temperature shock monitor. Alternatively, the energy barrier may be overcome using a temperature shock. After the energy barrier is overcome, a portion of the diffusion material may be within the solvent material. In some embodiments, the activation energy of the diffusion material in the solvent material is large such that most of the diffusion material atoms remain located near the interface of the solvent material and the diffusion barrier material.

At block 803, the temperature shock monitor diffuses a first diffusion material in the solvent material by exposing the temperature shock monitor to a temperature sufficient to exceed the energy barrier. The diffusion material will diffuse deeper into the solvent material when exposed to the high temperature and affect one or more electrical properties of the temperature shock monitor. In some embodiments, exposing the temperature shock monitor to a sufficiently high temperature may be done in the course of storing the temperature shock monitor, in the course of transporting the temperature shock monitor, and/or in the course of operating an electronic device that is thermally coupled to the temperature shock monitor.

At block 805, a device detects an electrical property of the solvent material that is indicative of a concentration of the first diffusion material in the solvent material. The device that measures the electrical property may be the sensing circuit 705 of FIG. 7. Alternatively, a user of the temperature shock monitor may connect one or more external voltage/current sources and voltmeters/ammeters to the temperature shock monitor to measure one or more electrical properties of the temperature shock monitor. Examples of electrical properties that may be measured include diode leakage, junction voltage, gain, transient response, and threshold voltage, among others.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, some embodiments above describe using an n-type or p-type semiconductor material for a particular purpose. It should be understood that in some embodiments, the n-type and p-type semiconductor materials may be switched. Thus, embodiments, are not limited to any particular type of semiconductor material.

It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. Use of such ordinal terms in the claims does not necessarily have the same meaning or refer to the same component as components the specification that use the same ordinal terms.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A temperature shock monitor for determining whether a temperature threshold is exceeded, the temperature shock monitor comprising:
   a solvent material; and
   a first diffusion material, wherein an energy barrier between the solvent material and the first diffusion material is less than 2.0 eV and greater than or equal to 0.7 eV.

2. The temperature shock monitor of claim 1, wherein the first diffusion material is gold.

3. The temperature shock monitor of claim 1, further comprising a solvent-diffusion interface between the solvent material and the first diffusion material.

4. The temperature shock monitor of claim 1, further comprising:
   a first electrical contact in physical contact with the first diffusion material at a first location; and
   a second electrical contact in physical contact with the first diffusion material at a second location,
   wherein the solvent material is positioned at a third location between the first location and the second location.

5. The temperature shock monitor of claim 1, further comprising a second diffusion material, wherein an energy barrier between the solvent material and the second diffusion material is different from the energy barrier between the solvent material and the first diffusion material.

6. The temperature shock monitor of claim 1, further comprising a diffusion barrier material positioned between the solvent material and the first diffusion material, wherein an energy barrier between the first diffusion material and the diffusion barrier material is greater than the energy barrier between the solvent material and the first diffusion material.

7. The temperature shock monitor of claim 6, wherein the solvent material comprises an n-type material and a p-type material and the temperature shock monitor further comprises a p-n junction formed from the n-type material and the p-type material.

8. The temperature shock monitor of claim 1, wherein:
the solvent material and the first diffusion material are included in a semiconductor device, and
whether the temperature threshold is exceeded is determined based on a leakage current or a reverse leakage current of the semiconductor device.

9. A semiconductor device comprising:
a core circuit; and
a temperature shock monitor in thermal contact with the core circuit and configured to determine whether a temperature threshold is exceeded, the temperature shock monitor comprising:
a solvent material; and
a first diffusion material, wherein an energy barrier between the solvent material and the first diffusion material is less than 2.0 eV and greater than or equal to 0.7 eV.

10. The semiconductor device of claim 9, wherein the first diffusion material is gold.

11. The semiconductor device of claim 9, wherein the temperature shock monitor further comprises a solvent-diffusion interface between the solvent material and the first diffusion material.

12. The semiconductor device of claim 9, wherein the temperature shock monitor further comprises:
a first electrical contact in physical contact with the first diffusion material at a first location; and
a second electrical contact in physical contact with the first diffusion material at a second location,
wherein the solvent material is positioned at a third location between the first location and the second location.

13. The semiconductor device of claim 9, wherein the temperature shock monitor further comprises a second diffusion material, wherein an energy barrier between the solvent material and the second diffusion material is different from the energy barrier between the solvent material and the first diffusion material.

14. The semiconductor device of claim 9, wherein the temperature shock monitor further comprises a diffusion barrier material positioned between the solvent material and the first diffusion material, wherein an energy barrier between the first diffusion material and the diffusion barrier material is greater than the energy barrier between the solvent material and the first diffusion material.

15. The semiconductor device of claim 14, wherein the solvent material comprises an n-type material and a p-type material and the temperature shock monitor further comprises a p-n junction formed from the n-type material and the p-type material.

16. The semiconductor device of claim 9, wherein:
the solvent material and the first diffusion material are included in a circuit element of the thermal shock monitor, and
whether the temperature threshold is exceeded is determined based on a leakage current or a reverse leakage current of the circuit element of the thermal shock monitor.

17. A temperature shock monitor for determining whether a temperature threshold is exceeded, the temperature shock monitor comprising:
a diffusion material having a first activation energy;
a solvent material having a second activation energy; and
a diffusion barrier positioned between the diffusion material and the solvent material, wherein the diffusion barrier has a third activation energy that is higher than each of the first activation energy and the second activation energy.

18. The temperature shock monitor of claim 17, wherein a difference between the first activation energy and the third activation energy is an activation barrier in a range of about 1 eV to about 3 eV.

19. The temperature shock monitor of claim 17, wherein a difference between the second activation energy and the third activation energy is in a range of about 1 eV to about 3 eV.

20. The temperature shock monitor of claim 17,
wherein the solvent material is comprised of a channel, and
wherein the temperature shock monitor is further comprised of first and second conduction regions separated by the channel.

* * * * *